(12) United States Patent
Russo et al.

(10) Patent No.: US 10,658,428 B2
(45) Date of Patent: May 19, 2020

(54) METHODS OF OPERATING MEMORY DEVICES AND APPARATUSES

(71) Applicant: Micron Technology, Inc., Boise, ID (US)

(72) Inventors: Ugo Russo, Boise, ID (US); Andrea Redaelli, Casatenovo (IT); Giorgio Servalli, Fara Gera D'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/185,729

(22) Filed: Nov. 9, 2018

(65) Prior Publication Data

US 2019/0081104 A1 Mar. 14, 2019

Related U.S. Application Data

(60) Continuation of application No. 15/487,743, filed on Apr. 14, 2017, now Pat. No. 10,128,315, which is a division of application No. 14/285,286, filed on May 22, 2014, now Pat. No. 9,627,440.

(51) Int. Cl.
*H01L 27/24* (2006.01)
*H01L 45/00* (2006.01)

(52) U.S. Cl.
CPC ...... *H01L 27/2445* (2013.01); *H01L 27/2463* (2013.01); *H01L 45/06* (2013.01); *H01L 45/126* (2013.01); *H01L 45/1233* (2013.01); *H01L 45/141* (2013.01); *H01L 45/16* (2013.01); *H01L 45/1608* (2013.01); *H05K 999/99* (2013.01); *H01L 45/144* (2013.01)

(58) Field of Classification Search
None
See application file for complete search history.

(56) References Cited

U.S. PATENT DOCUMENTS

| | | | |
|---|---|---|---|
| 8,243,497 | B1 | 8/2012 | Pellizzer et al. |
| 2009/0207681 | A1 | 8/2009 | Juengling |
| 2010/0127234 | A1 | 5/2010 | Park |
| 2010/0308296 | A1 | 12/2010 | Pirovano et al. |
| 2012/0032136 | A1 | 2/2012 | Redaelli et al. |
| 2013/0048935 | A1 | 2/2013 | Gotti et al. |
| 2013/0051136 | A1 | 2/2013 | Redaelli et al. |
| 2013/0146833 | A1 | 6/2013 | Russo et al. |
| 2013/0187120 | A1 | 7/2013 | Redaelli et al. |

(Continued)

*Primary Examiner* — Steven B Gauthier
(74) *Attorney, Agent, or Firm* — TraskBritt (57) ABSTRACT

Phase change memory apparatuses include memory cells including phase change material, bit lines electrically coupled to aligned groups of at least some of the memory cells, and heating elements electrically coupled to the phase change material of the memory cells. The heating elements include vertical portions extending in a bit line direction. Additional phase change memory apparatuses include dummy columns positioned between memory columns and base contact columns. The dummy columns include phase change memory cells and lack heating elements coupled to the phase change memory cells thereof. Additional phase change memory apparatuses include heating elements operably coupled to phase change memory cells. An interfacial area between the heating elements and the phase change memory cells has a length that is independent of a bit line width. Methods relate to forming such phase change memory apparatuses.

18 Claims, 5 Drawing Sheets

(56) References Cited

U.S. PATENT DOCUMENTS

2013/0320288 A1    12/2013   Redaelli et al.
2015/0340408 A1*   11/2015   Russo ................. H01L 27/2445
                                                                             257/5

* cited by examiner

METHODS OF OPERATING MEMORY DEVICES AND APPARATUSES

CROSS-REFERENCE TO RELATED APPLICATION

This application is a continuation of U.S. patent application Ser. No. 15/487,743, filed Apr. 14, 2017, now U.S. Pat. No. 10,128,315, issued Nov. 13, 2018, which is a divisional of U.S. patent application Ser. No. 14/285,286, filed May 22, 2014, now U.S. Pat. No. 9,627,440, issued Apr. 18, 2017, the disclosure of each of which is hereby incorporated herein in its entirety by this reference.

TECHNICAL FIELD

Embodiments of the present disclosure relate to phase change memory devices and apparatuses. Embodiments of the present disclosure also relate to methods of forming such phase change memory devices and apparatuses.

BACKGROUND

Non-volatile memory devices are an important element of integrated circuits due to their ability to maintain data absent a power supply. Phase change materials have been investigated for use in non-volatile memory cells. Phase change memory ("PCM") cells include phase change materials, such as chalcogenide compounds, which are capable of stably transitioning between physical states (e.g., amorphous, semi-amorphous, and crystalline states). Each physical state exhibits a particular resistance that may be used to distinguish logic values of the memory cell.

To change the physical state of the phase change material of a PCM cell, an electrical current is applied to a heating element coupled to the phase change material. The amount of current required to sufficiently alter the physical state of the phase change material is related to the size of an area comprising an interface between the heating element and the associated phase change material. Thus, more current is required to change the physical state of a phase change material in a device if the interface area is larger compared to a device with a smaller interface area between the heating element and the phase change material.

Some non-volatile memory devices include an array of PCM cells and selection elements for selecting certain PCM cells for reading and writing operations. The array may include PCM cells aligned in a first direction that share a common conductive data/sense line (e.g., a common conductive bit line), and aligned in a second direction that share a common access line (e.g., a common conductive word line). The PCM cells may be coupled to the bit lines using a conductive adhesion material. The selection element may be a vertical PNP bipolar junction transistor (BJT) including a common p-doped semiconductor collector, an n-doped semiconductor base, and a p-doped semiconductor emitter. BJT selectors enable controlled selection of desired PCM cells in the array by, in part, allowing for electrical current to flow in only one direction across an interface between the oppositely doped semiconductor regions, depending on the voltage of the applied current. The PCM cells may be coupled to respective p-doped semiconductor emitters.

The PCM cell arrays may include groups of PCM cells and associated bit lines separated by base contacts for electrically contacting and accessing the n-doped semiconductor base region. The bit lines and the base contacts are formed of a conductive material. To facilitate the formation of bit lines and base contacts that do not directly electrically communicate, the PCM cells immediately adjacent to the base contacts may be formed without a full conductive bit line. The PCM cells immediately adjacent to the base contacts and lacking a bit line may be referred to as so-called "dummy cells." The conductive adhesion material coupled to the dummy cells may be referred to as so-called "dummy bit lines." During normal operation of the PCM cell arrays, the dummy cells and the dummy bit lines are not electrically accessed and are not used to store information.

BRIEF DESCRIPTION OF THE DRAWINGS

FIGS. 5 through 8 illustrate a method of forming a PCM device according to some embodiments of the present disclosure.

DETAILED DESCRIPTION

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques and materials employed in the industry.

The fabrication processes described herein do not describe a complete process flow for processing semiconductor structures. The remainder of the process flow is known to those of ordinary skill in the art. Accordingly, only the methods and memory device structures necessary to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure.

The illustrations presented herein are not meant to be actual views of any particular system, device, structure, or process, but are idealized representations which are employed to describe the embodiments of the present disclosure. The drawings presented herein are not necessarily drawn to scale.

As used herein, the term "apparatus" means and includes a device, such as a memory device (e.g., a PCM device), or a system that includes such a device.

As used herein, the terms "vertical" and "horizontal" merely refer to a drawing figure as oriented on the drawing sheet, and in no way are limiting of orientation of a PCM device or any portion thereof.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "underlying," etc., is used for clarity and convenience in understanding the disclosure and accompanying drawings and does not connote or depend on any specific preference, orientation, or order, except where the context clearly indicates otherwise.

As used herein, the term "forming" means and includes any method of creating, building, or depositing a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Depending on the specific material to be formed, the technique for forming the material may be selected by a person of ordinary skill in the art.

Embodiments of the present disclosure include semiconductor devices and apparatuses, such as phase change memory ("PCM") devices and apparatuses, that include base contact columns and PCM cell columns. The PCM devices and apparatuses may also include dummy cell columns. The PCM cell columns include heating elements with vertical portions that are aligned and extend in a direction of bit lines. A width of each of the PCM cell columns in the bit line direction may be independent of a width of each of the PCM cell columns in a word line direction. The dummy cell columns, if present, may lack heating elements or other conductive material between dummy cells of PCM material and underlying dummy cell contacts. Embodiments of the present disclosure also include methods of forming such PCM devices and apparatuses.

Figure 1:
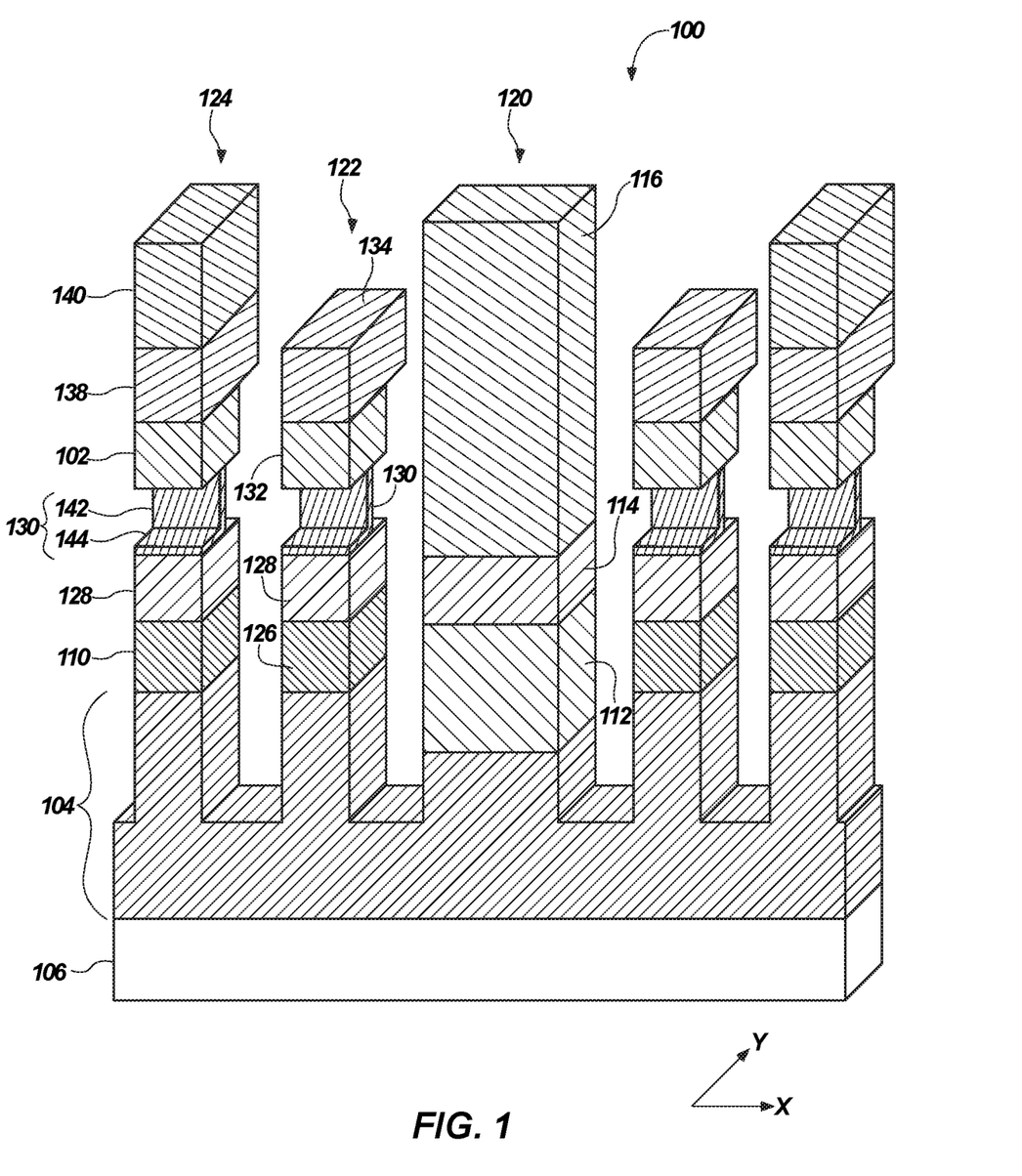
FIG. 1 is a schematic perspective view of a row of PCM cells associated with a single word line of a PCM device.
Figure 2:
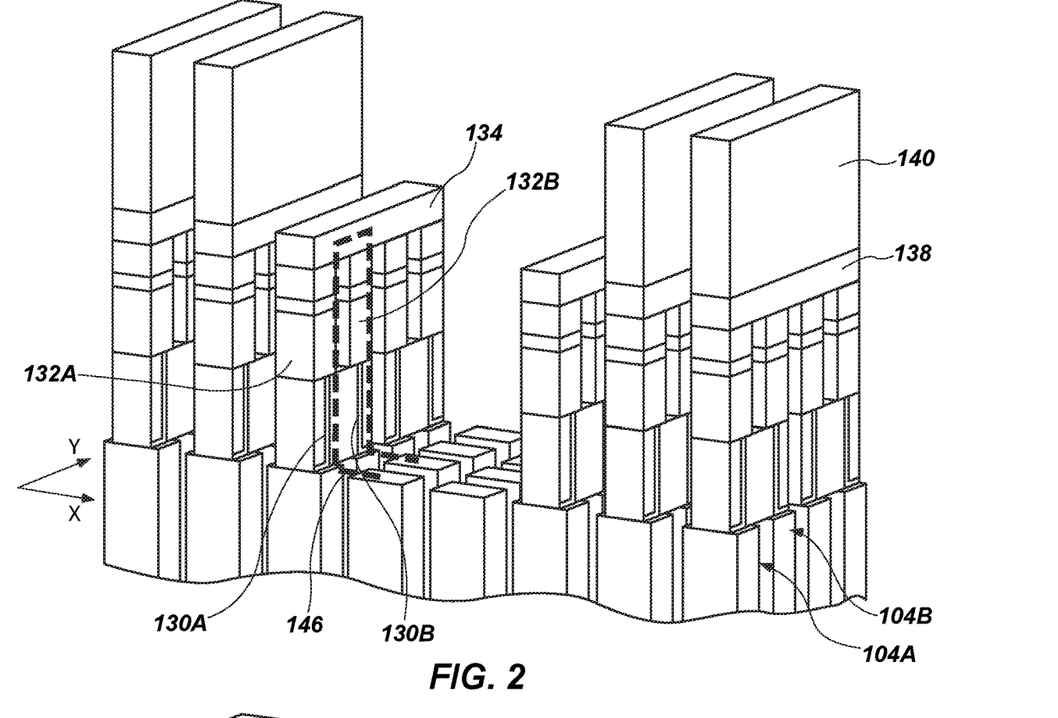
FIG. 2 is a partial perspective view of a PCM device.
Figure 3:
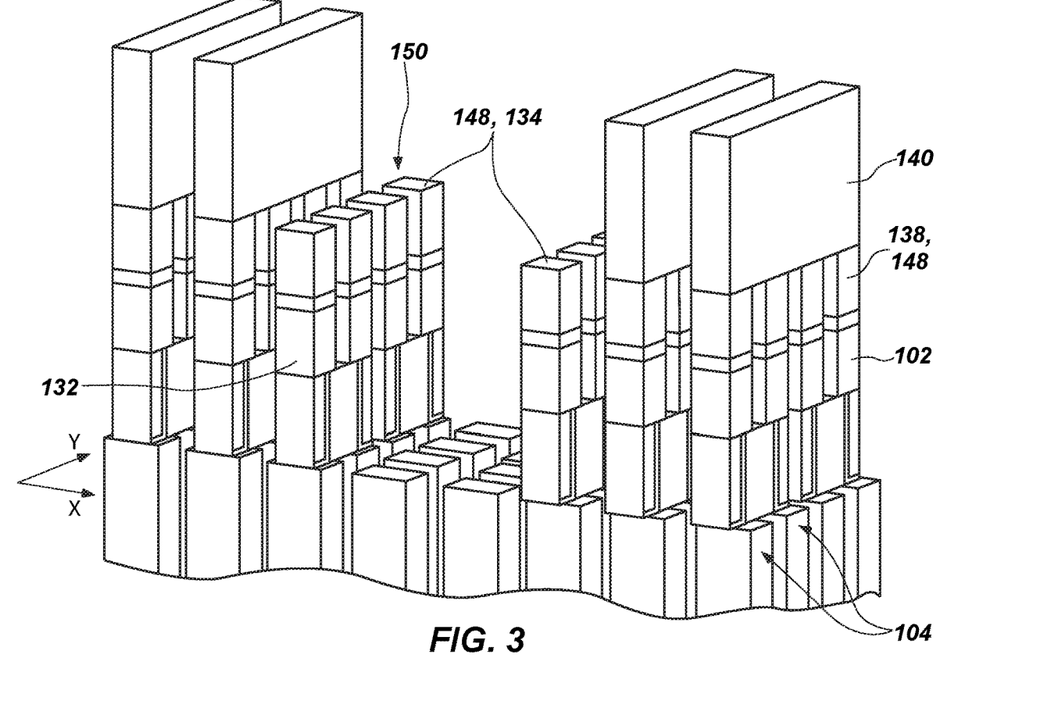
FIG. 3 is a partial perspective view of another PCM device.

FIGS. 1 through 3 and the accompanying description thereof in this specification are provided to enhance an understanding by one of ordinary skill in the art of embodiments of the present disclosure, and are not admitted by applicants as prior art for any purpose.

FIG. 1 illustrates a row 100 of a PCM device including PCM cells 102 associated with a single word line 104. The row 100 includes elements of a PNP bipolar junction transistor (BJT) selector, including a common p-doped semiconductor collector region 106 (also referred to as a "P-collector" region 106), an n-doped semiconductor base region 104 (also referred to as an "N-base" region 104 or word line 104), and p-doped semiconductor emitter regions 110 (also referred to as "P-emitter" regions 110). An N+ base region 112 is between one or more lower base contacts 114 and the N-base region 104.

The row 100 includes one or more base contact columns 120, one or more dummy cell columns 122 adjacent to the one or more base contact columns 120, and PCM cell columns 124 adjacent to the one or more dummy cell columns 122 on a side of the one or more dummy cell columns 122 opposite the base contact columns 120. The one or more base contact columns 120 each include an N+ base region 112 over the N-base region 104, a lower base contact 114, and an upper base contact 116. FIG. 1 illustrates a single base contact column 120, although more than one base contact columns 120 may be associated with a single word line 104.

Each of the one or more dummy cell columns 122 includes a doped semiconductor region 126 over the N-base region 104, a cell contact 128, a heating element 130, a PCM cell 132 (also referred to as a "dummy cell" 132 since it is not used in normal use and operation of the PCM device), and a conductive adhesion material 134 (also referred to as a "dummy bit line" 134 since it connects adjacent dummy cells 132 in a bit line direction).

Each of the PCM cell columns 124 includes a P-emitter region 110 over the N-base region 104, a cell contact 128, a heating element 130, a PCM cell 102, a conductive adhesion material 138, and a conductive bit line material 140 (also referred to simply as a "bit line" 140).

For convenience in describing FIG. 1, a first direction may be defined as a direction in which the word lines 104 extend, shown in FIG. 1 as the x-direction. A second direction, which is transverse (e.g., perpendicular) to the first direction, may be defined as a direction in which the bit lines 140 extend, shown in FIG. 1 as the y-direction. The x-direction is also referred to as the "word line direction," and the y-direction is also referred to as the "bit line direction." The heating elements 130 may be L-shaped with a vertical wall 142 and a horizontal portion 144. The vertical walls 142 of adjacent heating elements 130 in the row 100 may be substantially coplanar and extend in the first direction (e.g., the x-direction, the word line direction).

The N+ base region 112 may be n-doped by ion implantation, as is known in the art. In some instances, such implantation has been observed to result in at least partial n-doping of the adjacent doped semiconductor region 126 in the one or more dummy cell columns 122 due to the imprecision of implantation techniques or due to the lateral migration of ions during or after the implantation process. Accordingly, the amount and type of doping in the doped semiconductor region 126 in the one or more dummy cell columns 122 may be difficult to define and control, and the doped semiconductor region 126 may have characteristics of either a p-doped semiconductor or an n-doped semiconductor. Such difficulties increase with smaller feature sizes due to the close proximity of the one or more dummy cell columns 122 and the one or more base contact columns 120. If the doped semiconductor region 126 in the one or more dummy cell columns 122 is sufficiently n-doped, an electrical short may be formed between the doped semiconductor region 126 and the underlying N-base region 104.

In such a situation, electrical communication may be established between adjacent word lines 104 through the dummy bit lines 134, as shown in FIG. 2. In particular, an electrical pathway (shown schematically in FIG. 2 at reference numeral 146) may be formed from a first word line 104A, through a first doped semiconductor region 126 (which is at least partially n-doped) (see FIG. 1; not shown in FIG. 2), through a first heating element 130A, through a first dummy cell 132A, across a dummy bit line 134 and to an adjacent, second dummy cell 132B, through a second heating element 130B, through a second doped semiconductor region 126 (see FIG. 1; not shown in FIG. 2), and to a second word line 104B adjacent to the first word line 104A. Such an electrical pathway 146 may result in a loss of an ability to uniquely select and apply an electrical current to an individual word line 104 for selecting a unique PCM cell 102 or row of PCM cells 102.

Referring to FIG. 3, one possible method of eliminating the electrical pathway 146 shown schematically in FIG. 2 may be to pattern the dummy bit lines 134 (and the conductive adhesion materials 138 of the PCM cell columns 124) in both of the first direction (i.e., x-direction) and second direction (i.e., y-direction) to form dots 148 of conductive adhesion material over the dummy cells 132 and over the PCM cells 102. The patterning of the dummy bit lines 134 may form gaps 150 between the dots 148 over adjacent dummy cells 132. The gaps 150 may break the electrical pathway 146 (FIG. 2) and reduce (e.g., eliminate) undesired electrical communication between adjacent word lines 104. However, forming the gaps 150 may require additional or different fabrication processes compared to processes that leave the dummy bit lines 134 intact. In addition, an upper surface area of the remaining dots 148 over the PCM cells 102 may be reduced compared to the conductive adhesion materials 138 that extend continuously in the second direction (i.e., the y-direction). Such a reduction in surface area and formation of gaps 150 over the PCM cells 102 may increase a risk of the material of the bit lines 140 contacting and potentially contaminating the material of the PCM cells 102. Such a contamination of the PCM cells 102 may result in the PCM cells 102 not functioning properly.

Figure 4A:
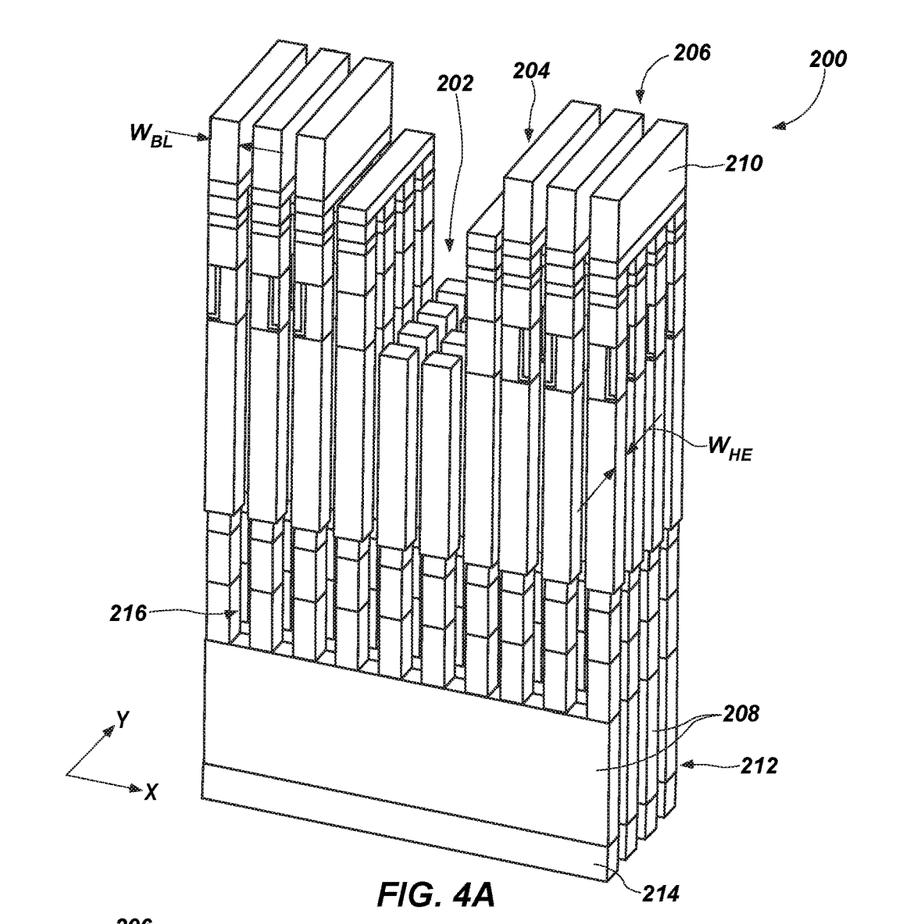
FIG. 4A is a partial perspective view of a PCM device according to some embodiments of the present disclosure.

FIG. 4A illustrates a PCM device 200 according to some embodiments of the present disclosure. The PCM device 200 includes base contact columns 202, one or more dummy cell columns 204 adjacent to the base contact columns 202, and PCM cell columns 206 adjacent to the base contact columns 202 on a side thereof opposite the base contact columns 202. N-base regions 208 may form and be referred to as access lines (e.g., word lines) 208 extending in a first direction (i.e., x-direction). Bit lines 210 may be coupled to PCM cell columns 206 and may extend in a second direction (i.e., y-direction) transverse (e.g., perpendicular) to the first direction. Although FIG. 4A illustrates two base contact columns 202 associated with each word line 208, in other embodiments, there may be only one or more than two base contact columns 202 associated with each word line 208.

The base contact columns 202, one or more dummy cell columns 204, and PCM cell columns 206 (and/or portions of each of such columns) may be physically and electrically isolated from each other by so-called "shallow trench isolation" (also referred to as "STI"). For example, deep STI trenches 212 may be formed in the first direction to a depth that extends into a common P-collector region 214, and shallow STI trenches 216 may be formed in the second direction to a depth that extends into the N-base region 208. The terms "deep STI trench" and "shallow STI trench" relate the depths of the respective trenches to each other, and do not connote any particular depth value or range of depth values.

Figure 4B:
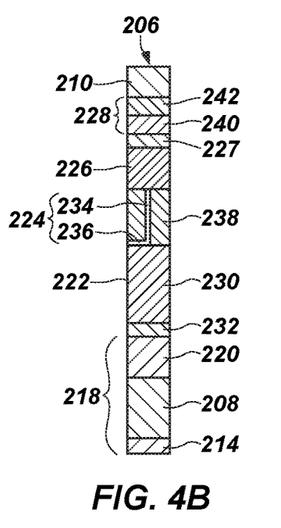
FIG. 4B is a schematic side view of a memory cell structure of the PCM device of FIG. 4A.

FIG. 4B schematically illustrates a composition and configuration of the PCM cell columns 206 according to some embodiments of the present disclosure. Referring to FIGS. 4A and 4B, each of the PCM cell columns 206 may include a BJT selector 218, a cell contact 222, a heating element 224, a PCM cell 226, a conductive adhesion material 228, and a bit line 210. The BJT selector 218 may include the common P-collector region 214, the N-base region 208 (also referred to as the "word line" 208), and a P-emitter region 220. The word line 208 may extend in a first direction shown in FIG. 4A as the x-direction. The cell contact 222 may include a conductive cell contact material 230 and, optionally, a conductive contact adhesion material 232. By way of example and not limitation, the conductive cell contact material 230 may be or include a tungsten material and the conductive cell contact material 232, if present, may be or include a cobalt silicide material.

The heating element 224 may be L-shaped with a vertical portion 234 and a horizontal portion 236. The heating element 224 may be or include a titanium nitride material, which may be doped with silicon, for example. The vertical portion 234 may be substantially planar and may extend in a second direction (i.e., y-direction, bit line direction) transverse (e.g., perpendicular) to the first direction. The heating element 224 may extend through a heating element dielectric 238, which may be formed of a single or multiple dielectric materials. For example, the heating element dielectric 238 may include a nitride material (e.g., silicon nitride) in contact with the heating element 224, to avoid or reduce oxidation of the heating element 224. The heating element dielectric 238 may alternatively or additionally include an oxide material (e.g., silicon oxide).

The PCM cell 226 may include a PCM material, such as a chalcogenide material (e.g., an alloy of germanium, antimony, and tellurium ("GST")), as is known in the art of PCM devices. The PCM cell 226 may directly contact an associated heating element 224. The conductive adhesion material 228 may include one or more conductive materials to form an electrical connection between the PCM cells 226 and the bit lines 210, such as a metal silicide material 240 (e.g., a tungsten silicide material) and a tungsten material 242. An additional conductive material 227 may also be disposed between the PCM cell 226 and the conductive adhesion material 228, such as to form a buffer between metallic elements of the conductive adhesion material 228 and the PCM cell 226. If present, the additional conductive material 227 may be, for example, a titanium nitride material. The bit lines 210 may include a conductive material, such as, for example, a copper material. In some embodiments, the PCM cells 226 may include a chalcogenide material and the bit lines 210 may include a copper material. However, copper is known to contaminate chalcogenide materials, resulting in inoperative PCM cells 226. Accordingly, the conductive adhesion material 228 or a portion thereof may form a chemical buffer between the PCM cells 226 and the bit lines 210.

The bit line 210 may have a bit line width $W_{BL}$, shown in FIG. 4A, taken in the first direction (i.e., x-direction, word line direction). The heating element 224 may have a heating element width $W_{HE}$, shown in FIG. 4A, taken in the second direction (i.e., y-direction, bit line direction). As discussed above, an operating current of the PCM device 200 may be at least in part related to an area of an interface between the heating element 224 and the PCM cell 226. Therefore, a reduction in the heating element width $W_{HE}$ (and a corresponding reduction in the area of the interface) may enable a reduction of the operating current. Forming the vertical portion 234 of the heating elements 224 to extend in the second direction (i.e., y-direction, bit line direction) enables the heating element width $W_{HE}$ to be independent from the bit line width $W_{BL}$. For example, the heating element width $W_{HE}$ may be less than the bit line width $W_{BL}$. Thus, the heating element width $W_{HE}$ may be reduced to reduce the operating current of the PCM device 200, while the bit line width $W_{BL}$ may be increased or remain the same to facilitate the formation and alignment of the bit lines 210 in connection with the conductive adhesion materials 228 (e.g., by providing a greater process margin) and to provide a larger chemical buffer between the bit lines 210 and the underlying PCM cells 226.

Figure 4C:
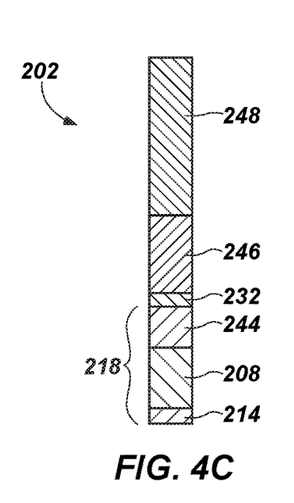
FIG. 4C is a schematic side view of a base contact structure of the PCM device of FIG. 4A.

FIG. 4C schematically illustrates a composition and configuration of the base contact columns 202 according to some embodiments of the present disclosure. Referring to FIGS. 4A and 4C, each of the base contact columns 202 may include a common P-collector region 214, an N-base region 208, and an N+ base region 244 of the BJT selector 218. The base contact columns 202 may include a lower base contact 246, an upper base contact 248, and, optionally, a conductive cell contact material 232. The lower base contact 246, upper base contact 248, and conductive cell contact material 232 may be or include the same materials as the cell contacts 222 of the PCM cell columns 206 described above with reference to FIG. 4B. By way of example and not limitation, the conductive cell contact material 232 (if present) may be or include titanium nitride, and the lower and upper base contacts 246, 248 may be or include a tungsten material. The upper base contacts 248 are not shown in FIG. 4A to better visualize other portions of the PCM device 200 thereof.

Figure 4D:
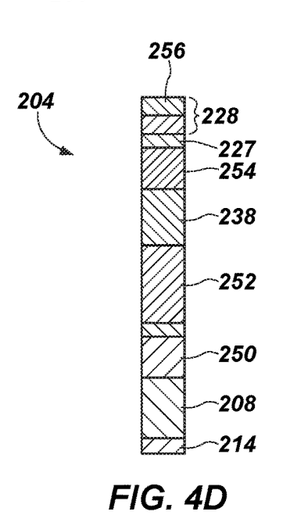
FIG. 4D is a schematic side view of a dummy cell structure of the PCM device of FIG. 4A.

FIG. 4D schematically illustrates a composition and configuration of each of the dummy cell columns 204 according to some embodiments of the present disclosure. Referring to FIGS. 4A and 4D, each of the dummy cell columns 204 may include the common P-collector region 214, the N-base region 208, a doped semiconductor region 250, a dummy cell contact 252, a heating element dielectric 238, a PCM cell material 254 (also referred to as a "dummy cell" 254), and a conductive adhesion material 256 (also referred to as a "dummy bit line" 256).

Due to the implantation process used to form the N+ base region 244 (FIGS. 4A and 4C), small feature sizes, and/or migration of ions from the N+ base region 244, the doping of the doped semiconductor regions 250 of the one or more dummy cell columns 204 may be difficult to control. Therefore, the doped semiconductor region 250 of any particular dummy cell column 204 in the PCM device 200 may be formed of a p-doped, partially n-doped, or fully n-doped material. The doped semiconductor region 250 may be p-doped as initially formed, but may be partially or fully n-doped as a result of the implantation of the N+ base region 244. In some embodiments, the doped semiconductor region 250 of at least one of the dummy cell columns 204 of the PCM device 200 may be sufficiently n-doped to form an electrical short between the dummy cell contact 252 and the N-base region 208.

The dummy cell contact 252 may be or include the same material(s) as the cell contacts 222 of the PCM cell columns 206 described above with reference to FIG. 4B. The one or more dummy cell columns 204 may lack a heating element 224 (FIGS. 4A and 4B). Rather, the dummy cell contacts 252 may be physically and electrically isolated from the PCM material of the dummy cells 254 by the heating element dielectric 238. Accordingly, formation of an electrical pathway between adjacent word lines 208 (as described above with reference to FIG. 2) may be avoided by forming the dummy cell columns 204 without any heating element 224 or other conductive material between the dummy cells 254 and the dummy cell contacts 252. Thus, formation of an electrical pathway between the adjacent word lines 208 may be avoided in a manner that does not include the formation of gaps in the conductive adhesion material 256 (i.e., a dummy bit line) over the dummy cells 254 and in the conductive adhesion material 228 over the PCM cells 226 of the PCM cell columns 206, as described above with reference to FIG. 3.

Accordingly, the present disclosure includes phase change memory apparatuses that include memory cells comprising a phase change material. Bit lines are electrically coupled to respective aligned groups of at least some of the memory cells. The bit lines extend in a bit line direction. Heating elements are electrically coupled to respective phase change material of individual memory cells. The heating elements comprise respective vertical portions extending in the bit line direction.

In addition, the present disclosure includes PCM apparatuses that include memory columns, BJT selectors, base contact columns, and dummy cell columns. The memory columns include PCM cells, heating elements coupled to the PCM cells, conductive adhesion materials coupled to the PCM cells on a side thereof opposite the heating elements, and conductive bit lines coupled to the conductive adhesion materials. The conductive bit lines extend in a bit line direction. The BJT selectors include n-doped semiconductor base regions extending in a word line direction transverse to the bit line direction. The base contact columns are coupled to the n-doped semiconductor base regions. The dummy cell columns are positioned between the memory columns and the base contact columns and include PCM cells positioned over a dielectric material. The dummy cell columns lack heating elements coupled to the PCM cells thereof.

The present disclosure also includes PCM apparatuses that include an array of PCM cells, bit lines coupled to PCM cells of the array that are aligned in a first direction, and heating elements operably coupled to the PCM cells. The bit lines have a length in the first direction and a bit line width in a second direction transverse (e.g., perpendicular) to the first direction. An elongated interfacial area between the heating elements and the PCM cells has a length in the first direction that is independent of (e.g., shorter than) the bit line width.

FIGS. 5 through 8 illustrate a method of forming a PCM memory device, such as the PCM device 200 described above with reference to FIGS. 4A through 4D.

Figure 5:
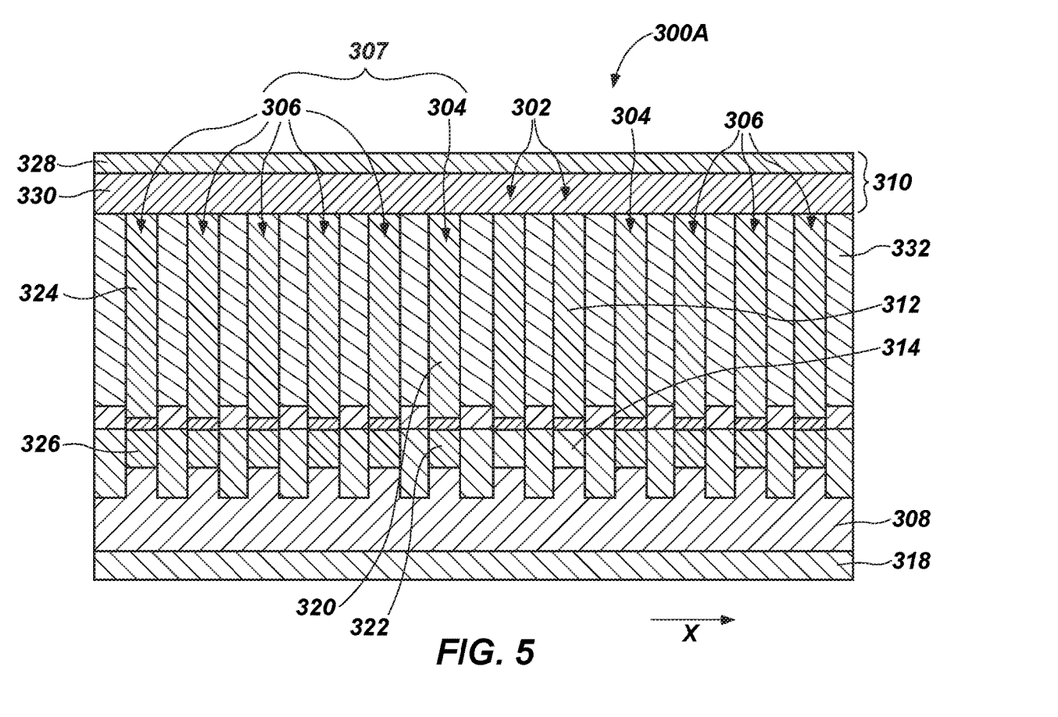
FIG. 5 is a cross-sectional view of a PCM structure according to some embodiments of the present disclosure.

FIG. 5 illustrates a cross-sectional view of a PCM structure 300A that includes partially formed base contact columns 302, partially formed dummy cell columns 304, and partially formed PCM cell columns 306 (referred to collectively as "columns 306"). The cross-sectional view of FIG. 5 is taken along a direction that a word line 308 extends (i.e., the x-direction, as identified in FIG. 5). A heating element dielectric material 310 is formed over the columns 307 and intermediate materials. Example compositions and structures of portions of the columns 307 below (as shown in the perspective of FIG. 5) the heating element dielectric material 310 are described above with reference to FIGS. 4A through 4D. Thus, each of the partially formed base contact columns 302 may include a lower base contact 312, an N+ base region 314, an N-base region 308 (also referred to as a word line 308), and a common P-collector region 318. Each of the partially formed dummy cell columns 304 may include a dummy cell contact 320, a doped semiconductor region 322, the N-base region 308, and the common P-collector region 318. The doped semiconductor region 322 of at least one of the dummy cell columns 304 may be sufficiently n-doped to form an electrical short between the dummy cell contact 320 and the underlying N-base region 308. Each of the partially formed PCM cell columns 306 may include a PCM cell contact 324, a P-emitter region 326, the N-base region 308, and the common P-collector region 318. A distance between identical features on adjacent PCM cell columns 306, which includes a width of the PCM cell columns 306 and a width of a space between the adjacent PCM cell columns 306, may be referred to as a "pitch" of the PCM cell columns 306. The PCM cell columns 306 may be formed using conventional photolithography techniques, or may be formed at a smaller pitch than is feasible using conventional photolithographic techniques, such as by so-called "pitch multiplication" techniques, as is known in the art. If pitch multiplication techniques are used, then at least some features (e.g., the PCM cell columns 306) of the PCM structure 300A may have a so-called "tight pitch," which may be characterized as a feature pitch that is smaller than is possible with conventional photolithographic techniques.

The heating element dielectric material 310 over the columns 307 may include an oxide material 328 formed over a nitride material 330. The heating element dielectric material 310 may be formed to at least substantially cover the columns 307 and any intervening dielectric material 332.

Figure 6:
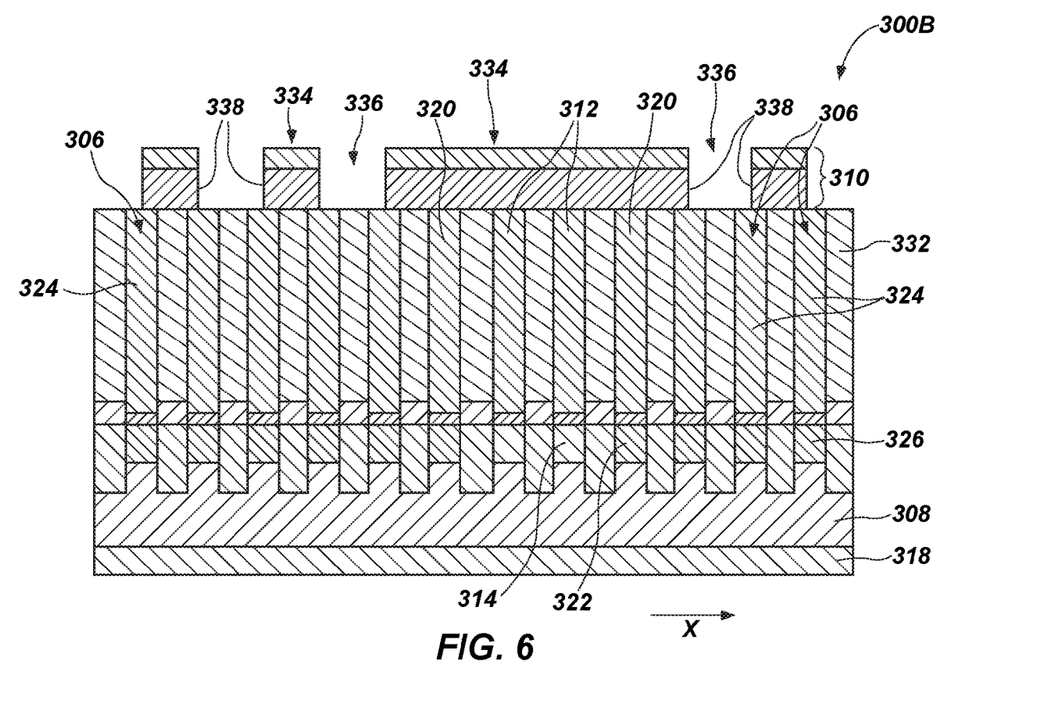
FIG. 6 is a cross-sectional view of the PCM structure of FIG. 5 after a dielectric material is patterned.

Referring to FIG. 6, the heating element dielectric material 310 may be patterned by selectively removing portions thereof to form elongated dielectric structures 334 separated by trenches 336 to form a PCM structure 300B. The elongated dielectric structures 334 and trenches 336 may have a length that extends in a bit line direction (i.e., into and out of the page from the perspective of FIG. 6). The elongated dielectric structures 334 may be formed such that sidewalls 338 thereof are aligned with and positioned over the PCM cell contacts 324 of the PCM cell columns 306. As shown in FIG. 6, the elongated dielectric structures 334 may cover the lower base contacts 312 and the dummy cell contacts 320, such that no sidewalls 338 are aligned with the lower base contacts 312 or the dummy cell contacts 320. Rather, the lower base contacts 312 and the dummy cell contacts 320 may remain covered by the heating element dielectric material 310 of the elongated dielectric structures 334.

Figure 7:
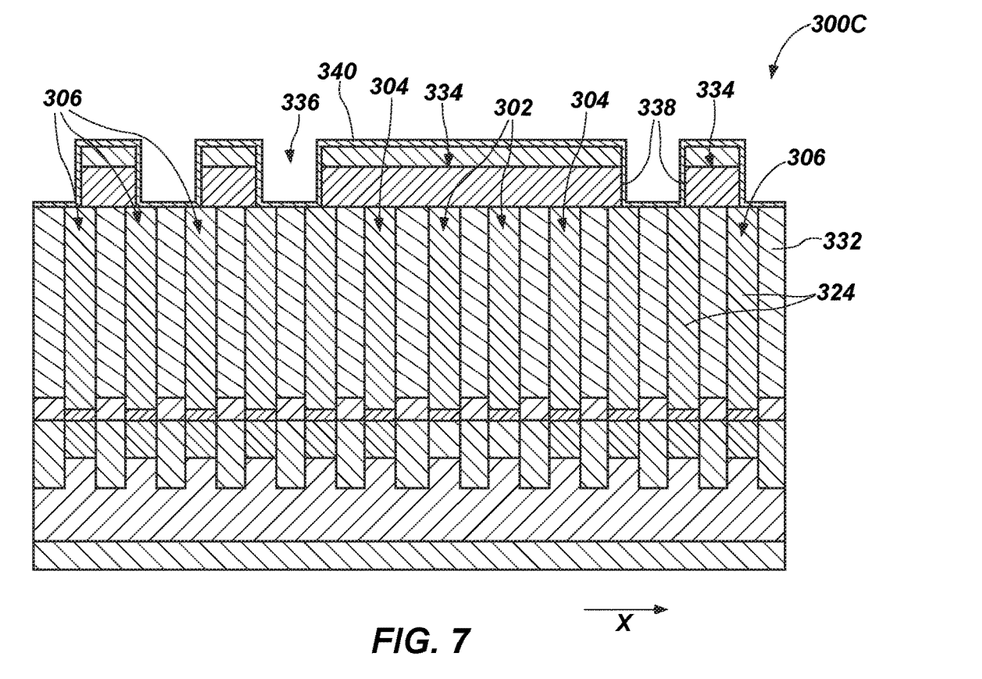
FIG. 7 is a cross-sectional view of the PCM structure of FIG. 6 after a heating element material is formed.

Referring to FIG. 7, a heating element material 340 may be formed over the heating element dielectric material 310, along the sidewalls 338 of the elongated dielectric structures 334, and over the PCM cell contacts 324 at a bottom of the trenches 336 to form a PCM structure 300C. The heating element material 340 may conform to features (e.g., the elongated dielectric structures 334 and trenches 336) of the PCM structure 300C. By way of example and not limitation, the heating element material 340 may be a metal nitride material (e.g., WN, TiN) or a metal nitride composite material (e.g., WCN, TiAlN, TiSiN) formed by a chemical vapor deposition (CVD) process. Portions of the heating element material 340 that extend along the sidewalls 338 may ultimately correspond to vertical portions of heating elements for PCM cells.

Figure 8:
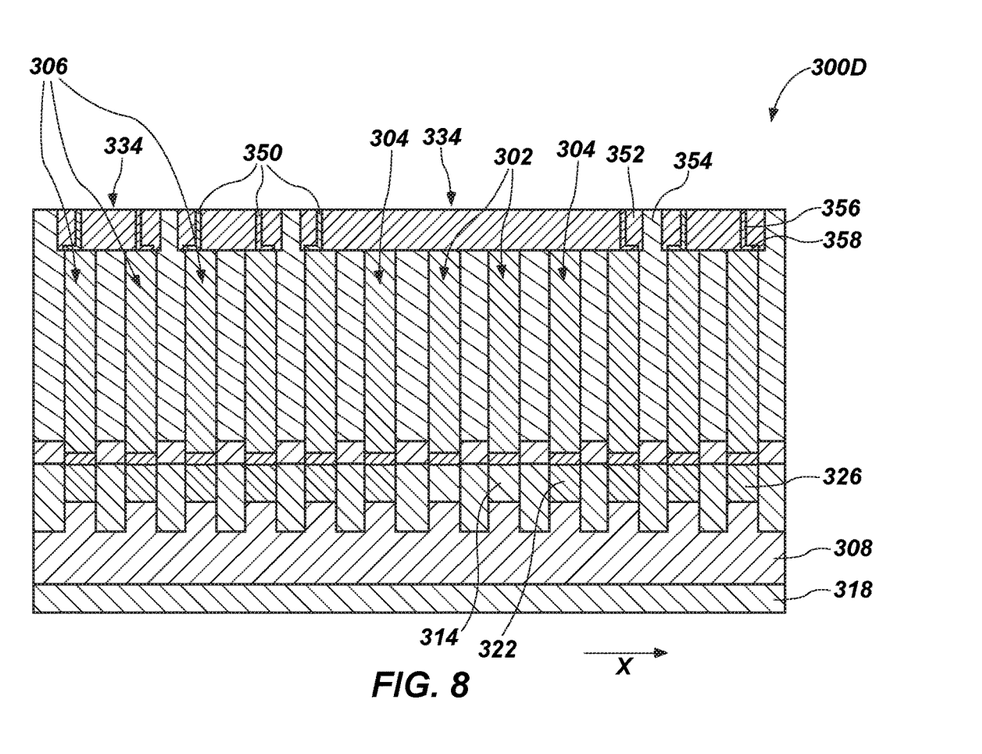
FIG. 8 is a cross-sectional view of the PCM structure of FIG. 7 after material removal, filling, and planarization operations are completed.

Referring to FIG. 8 in conjunction with FIG. 7, a PCM structure 300D may be formed by patterning the heating element material 340 to form heating elements 350. The patterning of the heating element material 340 may include removing horizontal portions thereof from over the heating elongated dielectric structures 334 and from within the trenches 336. In addition, a dielectric spacer material 352 and a dielectric filler material 354 may be formed within the trenches 336. Example, non-limiting methods of patterning the heating element material 340 and forming the dielectric spacer material 352 and dielectric filler material 354 are described in U.S. patent application Ser. No. 12/481,496, filed Jun. 9, 2009, titled "Phase Change Memory Cell with Self-Aligned Vertical Heater" (hereinafter "the '496 application"). In particular, the '496 application describes, with reference to FIGS. 6 through 8 therein, methods of patterning a heating element material and forming a dielectric spacer material and a dielectric filler material.

Referring to FIG. 8 in conjunction with FIG. 7 of the present disclosure, for example, a conformal dielectric spacer material 352 may be formed over the heating element material 340, including within the trenches 336. The conformal dielectric spacer material 352 may be, for example, a nitride material (e.g., a silicon nitride material) formed by a CVD process. Horizontal portions of the conformal dielectric spacer material 352 and of the heating element material 340 may be removed by an anisotropic material removal process, such as by an anisotropic dry etch process. The conformal dielectric spacer material 352 and the heating element material 340 may be fully removed from over tops of the elongated dielectric structures 334.

Additionally, portions of the conformal dielectric spacer material 352 and the heating element material 340 may be removed from within the trenches 336 to physically and electrically isolate adjacent heating elements 350 within each trench 336. Each of the heating elements 350 may be L-shaped and may include a vertical portion 356 and a horizontal portion 358. The dielectric filler material 354 may then be formed between adjacent dielectric spacer materials 352 and heating elements 350 within the trenches 336. By way of example and not limitation, the dielectric filler material 354 may be an oxide material (e.g., a silicon oxide material). Excess dielectric filler material 354 may be removed from over the dielectric spacer materials 352 and heating elements 350, such as with a chemical-mechanical polishing (CMP) process. In embodiments in which the heating element dielectric material 310 includes an oxide material 328 and a nitride material 330, the oxide material 328 may also be removed from over the nitride material 330.

After the PCM structure 300D of FIG. 8 is formed, additional material formation and patterning processes that are known in the art may be performed to complete the formation of a PCM device, such as the PCM device 200 of FIG. 4A. In particular, a PCM material, one or more conductive materials, and one or more conductive adhesion materials may be formed over the PCM structure 300D and patterned to form PCM cells, bit lines, and other elements described above with reference to FIGS. 4A through 4D. Example, non-limiting methods that may be employed to complete the formation of a PCM device from the PCM structure 300D of FIG. 8 are described in the '496 application with reference to FIGS. 9 through 11 therein. However, the heating elements 224, 350 of the present disclosure are rotated 90° from the orientation shown and described in the '496 application, with respect to the word lines. In addition, no heating elements 224, 350 may be formed under and coupled to PCM cells (e.g., dummy cells) immediately adjacent to bit contacts in the present disclosure. Furthermore, since the vertical portions 234, 356 of the heating elements 224, 350 of the present disclosure extend in the bit line direction instead of in the word line direction, the PCM cells 226 may be defined with the heating element width $W_{HE}$ (FIG. 4A) independent of and, in some embodiments, shorter than the bit line width $W_{BL}$ (FIG. 4A), as described above.

Apparatuses of the present disclosure lacking heating elements in the dummy cell columns may include dummy cells that are not electrically coupled to an underlying doped semiconductor material. Such a lack of heating elements in the dummy cell columns may reduce (e.g., avoid) the formation of electrical shorts between adjacent word lines. In addition, apparatuses of the present disclosure may operate at lower electrical currents based on the reduction in size of the interface between heating elements and respective PCM cells, while maintaining critical dimensions of bit lines (i.e., without reducing a width of the bit lines).

Accordingly, methods of forming phase change memory apparatuses of the present disclosure include patterning an n-doped semiconductor base region of a BJT selector to form word lines extending in a word line direction. A dielectric material is formed over base contacts for electrically connecting to the n-doped semiconductor base region and over p-doped semiconductor emitter regions of the BJT selector. The dielectric material is patterned to form elongated dielectric structures that extend in a bit line direction transverse to the word line direction. A heating element material may be formed over sidewalls of the elongated dielectric structures extending in the bit line direction.

The present disclosure includes additional methods of forming phase change memory apparatuses, wherein base contacts for electrical access to an n-doped semiconductor base region may be formed, and conductive cell contacts may be formed adjacent to the base contacts. Heating elements may be electrically coupled to some of the conductive cell contacts, without electrically coupling heating elements to conductive cell contacts immediately adjacent to the base contacts. A dielectric material may be formed over the conductive cell contacts immediately adjacent to the base contacts. Phase change memory cells may be formed over and coupled to the heating elements and over the dielectric material.

The embodiments of the disclosure described above and illustrated in the accompanying drawing figures do not limit the scope of the invention, since these embodiments are merely examples of embodiments of the disclosure. The invention is encompassed by the appended claims and their legal equivalents. Any equivalent embodiments lie within the scope of this disclosure. Indeed, various modifications of the present disclosure, in addition to those shown and described herein, such as other combinations and modifications of the elements described, will become apparent to those of ordinary skill in the art from the description. Such embodiments, combinations, and modifications also fall within the scope of the appended claims and their legal equivalents.

What is claimed is:

1. A method of operating a memory device, the method comprising:
   operating a memory cell of a memory device, the memory cell sharing a common access line with adjacent memory cells, the common access line including elongated portions extending in a first horizontal direction, and the memory cell sharing a common data line with adjacent memory cells, the common data line including elongated portions extending in a second horizontal direction, transverse to the first horizontal direction, wherein operating the memory cell comprises:
      applying an electrical current to a heating element coupled to a volume of phase change material, the heating element including a vertical portion having a thickness parallel to the first horizontal direction, a width parallel to the second horizontal direction, and a height in a vertical direction, transverse to the first horizontal direction and the second horizontal direction, wherein the thickness of the vertical portion parallel to the first horizontal direction is less than the width of the vertical portion parallel to the second horizontal direction; and
      altering a physical state of the volume of phase change material.

2. The method of claim 1, wherein operating the memory cell of the memory device comprises:
   the common access line being formed to include an access line width parallel to the second horizontal direction and an access line length parallel to the first horizontal direction, the access line width being less than the access line length; and
   the common data line being formed to include a data line width parallel to the first horizontal direction and a data line length parallel to the second horizontal direction, the data line width being less than the data line length.

3. The method of claim 1, wherein applying the electrical current to the heating element comprises flowing the electrical current along individual cell columns extending in the vertical direction.

4. The method of claim 3, further comprising physically and electrically isolating the individual cell columns from one another by first isolation regions extending in the first horizontal direction and by second isolation regions extending in the second horizontal direction, a depth of the first isolation regions being relatively greater than a depth of the second isolation regions.

5. The method of claim 1, wherein applying the electrical current to the heating element comprises flowing the electrical current from the common access line to the heating element in only one direction between oppositely doped semiconductor regions using a bipolar junction transistor selector.

6. The method of claim 1, wherein applying the electrical current to the heating element comprises forming an electrical connection between the heating element and a contact comprising a tungsten material underlying a horizontal portion of the heating element.

7. The method of claim 6, wherein the electrical current is based at least in part on an area of an interface between the heating element and the memory cell.

8. A method of operating a memory device, the method comprising:
   applying an electrical current to a heating element of at least one phase change memory cell of a memory cell array, the heating element including a vertical portion having a thickness parallel to a first horizontal direction, a width parallel to a second horizontal direction, transverse to the first horizontal direction, and a height in a vertical direction, transverse to the first horizontal direction and the second horizontal direction, the thickness of the vertical portion being less than the width thereof; and
   forming an electrical connection between a volume of phase change material of the at least one phase change memory cell and a common data line, without forming an electrical pathway through another volume of phase change material located in at least one dummy memory cell of the memory cell array.

9. The method of claim 8, further comprising conducting the electrical current through a common access line shared with adjacent phase change memory cells of the memory cell array, the common access line including elongated portions extending in the first horizontal direction.

10. The method of claim 8, wherein forming the electrical connection between the volume of phase change material and the common data line comprises forming the electrical connection to the common data line shared with adjacent phase change memory cells of the memory cell array, the common data line including elongated portions extending in the second horizontal direction.

11. The method of claim 10, wherein forming the electrical connection between the volume of phase change material and the common data line comprises forming the electrical connection between a copper material of the common data line and a chalcogenide material of the volume of phase change material while chemically buffering the copper material from the chalcogenide material with a conductive adhesion material located therebetween.

12. The method of claim 8, further comprising physically and electrically isolating the another volume of phase change material with no heating elements being in physical contact with the another volume of phase change material of the at least one dummy memory cell.

13. A method of operating an apparatus, the method comprising:
   altering a physical state of a volume of variable resistance material of at least one memory cell from a first state to a second state by applying an electrical current to an L-shaped heating element including a horizontal portion and a vertical portion coupled to the volume of variable resistance material to produce a phase change in the volume of variable resistance material, the vertical portion of the L-shaped heating element having a thickness parallel to elongated portions of a common access line parallel to a first horizontal direction, a width parallel to elongated portions of a common data line parallel to a second horizontal direction, transverse the first horizontal direction, and a height in a vertical direction, transverse to the first horizontal direction and the second horizontal direction, the thickness of the vertical portion being less than the width thereof.

14. The method of claim 13, wherein the electrical current is based at least in part on an area of an interface between the L-shaped heating element and the at least one memory cell.

15. The method of claim 13, further comprising reducing oxidation of the L-shaped heating element with a dielectric material located adjacent each of the horizontal portion and the vertical portion of the L-shaped heating element.

16. The method of claim 13, wherein applying the electrical current to the L-shaped heating element comprises the vertical portion of the L-shaped heating element being substantially planar.

17. The method of claim 13, wherein altering the physical state of the volume of variable resistance material of the at least one memory cell from the first state to the second state comprises transitioning at least a portion of the volume of variable resistance material between at least one of an amorphous state, a semi-amorphous state, or a crystalline state.

18. The method of claim 13, wherein altering the physical state of the volume of variable resistance material comprises alternating the altering the physical state of the volume of variable resistance material of at least one phase change memory cell without altering the physical state of another volume of variable resistance material of at least one dummy memory cell located proximate the at least one phase change memory cell, the at least one dummy memory cell lacking the L-shaped heating element.

* * * * *

UNITED STATES PATENT AND TRADEMARK OFFICE
CERTIFICATE OF CORRECTION

PATENT NO. : 10,658,428 B2  
APPLICATION NO. : 16/185729  
DATED : May 19, 2020  
INVENTOR(S) : Ugo Russo, Andrea Redaelli and Giorgio Servalli

Page 1 of 1

It is certified that error appears in the above-identified patent and that said Letters Patent is hereby corrected as shown below:

In the Claims

Claim 18, Column 14, Line 25, change "alternating the altering the" to --altering the--

Signed and Sealed this  
Fourteenth Day of July, 2020

Andrei Iancu  
*Director of the United States Patent and Trademark Office*